United States Patent
Oomori et al.

(10) Patent No.: US 11,566,177 B2
(45) Date of Patent: Jan. 31, 2023

(54) DRY ETCHING AGENT, DRY ETCHING METHOD AND METHOD FOR PRODUCING SEMICONDUCTOR DEVICE

(71) Applicant: Central Glass Company, Limited, Ube (JP)

(72) Inventors: Hiroyuki Oomori, Ube (JP); Akifumi Yao, Ube (JP); Takashi Kashiwaba, Kawagoe (JP)

(73) Assignee: Central Glass Company, Limited, Ube (JP)

( * ) Notice: Subject to any disclaimer, the term of this patent is extended or adjusted under 35 U.S.C. 154(b) by 442 days.

(21) Appl. No.: 16/473,664

(22) PCT Filed: Feb. 20, 2018

(86) PCT No.: PCT/JP2018/005824
§ 371 (c)(1),
(2) Date: Jun. 26, 2019

(87) PCT Pub. No.: WO2018/159368
PCT Pub. Date: Sep. 7, 2018

(65) Prior Publication Data
US 2019/0345385 A1    Nov. 14, 2019

(30) Foreign Application Priority Data
Feb. 28, 2017    (JP) .............................. JP2017-035848

(51) Int. Cl.
*C09K 13/00*    (2006.01)
*H01L 21/3065*    (2006.01)
(Continued)

(52) U.S. Cl.
CPC ............ *C09K 13/00* (2013.01); *H01L 21/308* (2013.01); *H01L 21/3065* (2013.01);
(Continued)

(58) Field of Classification Search
CPC ................ C09K 13/00; H01L 21/3065; H01L 21/32137
See application file for complete search history.

(56) References Cited

U.S. PATENT DOCUMENTS

| 4,581,101 A | 4/1986 | Senoue et al. |
| 5,084,583 A | 1/1992 | Rozen et al. |
(Continued)

FOREIGN PATENT DOCUMENTS

| JP | 58-134086 A | 8/1983 |
| JP | 60-77429 A | 5/1985 |
(Continued)

OTHER PUBLICATIONS

E.T McBee et al. "1, 3, 3, 3 Tetrafluoropropylene oxide" via https://pubs.acs.org/doi/pdf/10.1021/ja01112a517 ; pp. 4091-4092; (Year: 1953).*

(Continued)

*Primary Examiner* — Binh X Tran
(74) *Attorney, Agent, or Firm* — Crowell & Moring LLP

(57) ABSTRACT

The present invention aims to provide a dry etching agent having less load on global environment and capable of anisotropic etching without the use of special equipment and obtaining a good processing shape and to provide a dry etching method using the dry etching agent. The dry etching agent according the present invention contains at least a hydrofluoroalkylene oxide represented by the following chemical formula: $CF_3$—$C_xH_yF_zO$ (where x=2 or 3; y=1, 2, 3, 4 or 5; and z=2x-1-y) and having an oxygen-containing three-membered ring. The dry etching method according to the present invention includes selectively etching of at least one kind of silicon-based material selected from the group consisting of silicon dioxide, silicon nitride, polycrystalline silicon, amorphous silicon and silicon carbide with the use (Continued)

of a plasma gas generated by plasmatization of the dry etching agent.

12 Claims, 1 Drawing Sheet

(51) Int. Cl.
*H01L 21/308* (2006.01)
*H01L 21/311* (2006.01)
*H01L 29/16* (2006.01)

(52) U.S. Cl.
CPC .. *H01L 21/31116* (2013.01); *H01L 21/31144* (2013.01); *H01L 29/1608* (2013.01)

(56) References Cited

U.S. PATENT DOCUMENTS

| | | | |
|---|---|---|---|
| 6,514,425 B1 | 2/2003 | Sekiya et al. | |
| 2003/0019841 A1 | 1/2003 | Kesari et al. | |
| 2003/0127118 A1 | 7/2003 | Itano | |
| 2005/0014383 A1 | 1/2005 | Ji et al. | |
| 2007/0224829 A1 | 9/2007 | Ji et al. | |
| 2013/0105728 A1* | 5/2013 | Umezaki | H01L 21/31116 252/79.1 |
| 2018/0030015 A1* | 2/2018 | Farmer | C07D 307/60 |

FOREIGN PATENT DOCUMENTS

| | | |
|---|---|---|
| JP | 1-319714 A | 12/1989 |
| JP | 3-43776 B2 | 7/1991 |
| JP | 5-500945 A | 2/1993 |
| JP | 9-137274 A | 5/1997 |
| JP | 10-27781 A | 1/1998 |
| JP | 10-140151 A | 5/1998 |
| JP | 10-223614 A | 8/1998 |
| JP | 2004-536448 A | 12/2004 |
| JP | 2005-51236 A | 2/2005 |
| JP | 2017-50413 A | 3/2017 |

OTHER PUBLICATIONS

Sigma-Aldrich, "3,3,3-Trifluoro-1,2-epoxypropane", via https://www.sigmaaldrich.com/US/en/product/aldrich/667005; pp. 1-10; No publication date available.*

International Search Report (PCT/SIA/210) issued in PCT Application No. PCT/JP2018/005824 dated May 15, 2018 with English translation (five pages).

Japanese-language Written Opinion (PCT/ISA/237) issued in PCT Application No. PCT/JP2018/005824 dated May 15, 2018 (five pages).

McBee et al., Tetrafluoropropylene Oxide, Journal of American Chemical Society, Aug. 20, 1953, pp. 4091-4092, vol. 75, No. 16, two pages.

* cited by examiner

DRY ETCHING AGENT, DRY ETCHING METHOD AND METHOD FOR PRODUCING SEMICONDUCTOR DEVICE

FIELD OF THE INVENTION

The present invention relates to a dry etching agent containing a hydrofluoroalkylene oxide and a dry etching method using the dry etching agent.

BACKGROUND ART

Nowadays, ultrafine processing techniques are demanded in the field of semiconductor manufacturing. As such fine processing techniques, dry etching has become mainstream in place of wet processing. The dry etching is a process for forming a fine pattern on a molecular basis on a material surface by generation of plasma in a vacuum space.

For etching of semiconductor material such as silicon dioxide ($SiO_2$), perfluorocarbon (PFC) and hydrofluorocarbon (HFC) compounds typified by $CF_4$, $CHF_3$, $C_2F_6$, $C_3F_8$ and $C_4F_8$ have been used as etching agents in order to increase the etching rate of $SiO_2$ etc. relative to substrate materials such as silicon, polysilicon and silicon nitride.

However, these PFC and HFC compounds are specified as emission control materials in the Kyoto protocol (COP3) because each of the PFC and HFC compounds has a long atmospheric lifetime and a high global warming potential (GWP). In the semiconductor industry, there has been a demand for alternative materials low in GWP, high in economic efficiency and capable of fine processing.

Patent Document 1 discloses a method in which a reactive gas containing a perfluoroketone of 4 to 7 carbon atoms as a substitute for PFC and HFC compounds is used as a cleaning gas or etching gas. This reactive gas is however not always preferable as the etching gas due to the fact that a decomposition product of the perfluoroketone includes a considerable amount of high-GWP PFC compound and further includes a relatively high-boiling substance.

Patent Document 2 discloses a method in which a hydrofluoroether of 2 to 6 carbon atoms is used as a dry etching gas. However, this linear hydrofluoroether is generally high in GWP and is not preferable from the viewpoint of global environmental protection as in Patent Document 1.

Under the above circumstances, there has been a growing demand to develop compounds lower in GWP and industrially easy to produce. Studies have been made on the use of double or triple bond-containing unsaturated fluorocarbons for etching applications. As a technique relevant to such studies, Patent Document 3 discloses a method of etching a Si film, a $SiO_2$ film, a $Si_3N_4$ film or a high-melting metal silicide film with the use of an ether such as $C_aF_{2a+1}OCF=CF_2$ or a fluorinated olefin such as $CF_3CF=CFH$ or $CH_3CH=CH_2$.

Further, Patent Document 4 discloses a method of dry etching a semiconductor material with the use of a gas containing a perfluoro cyclic ether such as hexafluoropropylene oxide as an essential component.

PRIOR ART DOCUMENTS

Patent Documents

Patent Document 1: Japanese Laid-Open Patent Publication (Japanese Translation of International Application) No. 2004-536448

Patent Document 2: Japanese Laid-Open Patent Publication No. H10-140151

Patent Document 3: Japanese Laid-Open Patent Publication No. H10-223614

Patent Document 4: Japanese Examined Patent Publication No. H03-043776

Patent Document 5: Japanese Laid-Open Patent Publication (Japanese Translation of International Application) No. H5-500945

Patent Document 6: Japanese Laid-Open Patent Publication No. S58-134086

Non-Patent Documents

Non-Patent Document 1: E. T. McBee et al., J. Am. Chem. Soc., 1953, 75, 4091-4092

SUMMARY OF THE INVENTION

As mentioned above, the PFC and HFC compounds are specified as emission control materials because of their high GWP. Although the perfluoroketone, linear hydrofluoroether, hydrofluorovinyl ether and pefluoroether are known as alternative materials, these alternative materials have the problems that: a considerable amount of high-GWP PFC compound is contained in the decomposition product of the alternative material; and the alternative material is not easy to produce and is not economical. There has thus been a demand to develop a dry etching agent having less effect on global environment and having performance required.

As to etching performance in the case of plasma etching, $SiO_2$ is isotopically etched by e.g. generation of F radicals from $CF_4$ gas. In dry etching processes where fine processing is required, however, it is desirable to use a dry etching agent capable of anisotropic etching rather than isotropic etching.

It is an object of the present invention to provide a dry etching agent having less load on global environment and, at the same time, capable of anisotropic etching without the use of special equipment and obtaining a good processing shape, and to provide a dry etching method using the dry etching agent.

Means for Solving the Problems

As a result of extensive researches, the present inventors have found a hydrofluoroalkylene oxide as a substance suitable for anisotropic etching in a dry etching process and having less load on global environment.

Accordingly, the present invention provides a dry etching agent containing a hydrofluoroalkylene oxide. The dry etching agent may further contain an additive gas such as oxidizing gas or reducing gas and an inert gas.

Effects of the Invention

The hydrofluoroalkylene oxide contained in the dry etching agent according to the present invention has one oxygen atom in its molecule and a three-membered ring structure and shows an intramolecular distortion. Consequently, the decomposability of the hydrofluoroalkylene oxide by OH radicals in the air is higher than liner ethers; and the contribution of the hydrofluoroalkylene oxide to global warming is much smaller than PFC and HFC compounds such as $CF_4$ and $CF_3H$. The hydrofluoroalkylene oxide thus has less load on global environment.

In terms of etching performance, the hydrofluoroalkylene oxide enables anisotropic etching because the hydrofluoroalkylene oxide is a ring compound having a $CF_3$ group in the molecule to easily form $CF^{3+}$ ions and having a hydrogen atom or atoms in the molecule to show a low F/C ratio advantageous for protection of sidewalls of holes or grooves.

DETAILED DESCRIPTION OF THE EMBODIMENTS

Figure 1:
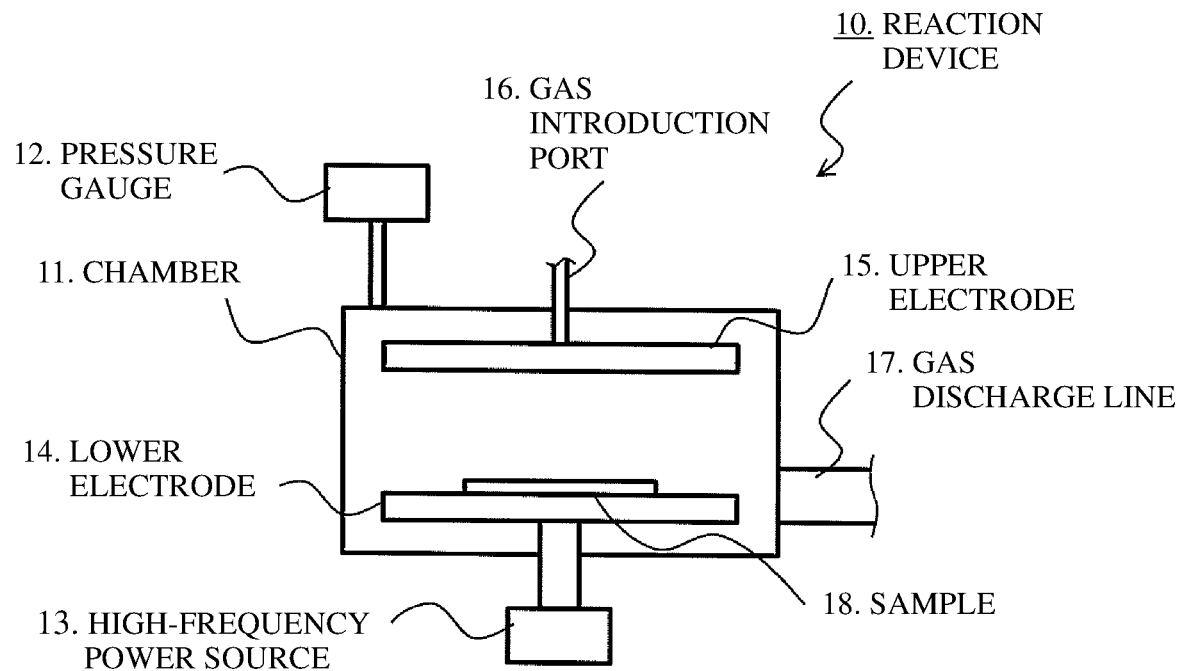
FIG. 1 is a schematic view of an experimental device used in the present invention.

Hereinafter, a dry etching agent according to the present invention will be explained in detail below.

The dry etching agent according to the present invention contains at least a hydrofluoroalkylene oxide represented by the chemical formula: $CF_3$—$C_xH_yF_zO$ (where x=2 or 3; y=1, 2, 3, 4 or 5; and z=2x−1−y) and having an oxygen-containing three-membered ring.

Specific examples of the hydrofluoroalkylene oxide are 1,3,3,3-tetrafluoropropylene oxide, 2,3,3,3-tetrafluoropropylene oxide, 1,1,3,3,3-pentafluoropropylene oxide, 1,2,3,3,3-pentafluoropropylene oxide, 1,4,4,4-tetrafluorobutylene oxide, 2,4,4,4-tetrafluorobutylene oxide, 3,4,4,4-tetrafluorobutylene oxide, 1,1,4,4,4-pentafluorobutylene oxide, 1,2,4,4,4-pentafluorobutylene oxide, 1,3,4,4,4-pentafluorobutylene oxide, 2,3,4,4,4-pentafluorobutylene oxide, 3,3,4,4,4-pentafluorobutylene oxide, 1,1,2,4,4,4-hexafluorobutylene oxide, 1,1,3,4,4,4-hexafluorobutylene oxide, 1,2,3,4,4,4-hexafluorobutylene oxide, 2,3,3,4,4,4-hexafluorobutylene oxide, 1,3,3,4,4,4-hexafluorobutylene oxide, 1,1,2,3,4,4,4-heptafluorobutylene oxide, 1,1,3,3,4,4,4-heptafluorobutylene oxide and 1,2,3,3,4,4,4-heptafluorobutylene oxide. These hydrofluoroalkylene oxide compounds respectively have trans and cis isomers, each of which can exist as enantiomers. In the present invention, the hydrofluoroalkylene oxide can be used in the form of either one of the isomers or a mixture of both of the isomers.

The hydrofluoroalkylene oxide used in the present invention can be obtained by a known method such as oxidation of a hydrofluoroolefin.

For example, Patent Document 5 discloses, as a synthesis method of a fluoroalkyl-containing epoxide, conversion of a fluoroalkyl-substituted olefin to a corresponding epoxide by oxidation with hypofluorous acid (HOF). The hydrofluoroalkylene oxide can be obtained by using this oxidization reaction. Patent Document 6 discloses oxidation of a perfluoropropene with sodium hypochlorite (NaClO). The hydrofluoroalkylene oxide can also be obtained by using this oxidization reaction.

As a method other than the oxidation of the hydrofluoroolefin, Non-Patent Document 1 discloses a method of producing 1,3,3,3-tetrafluoropropene oxide through a multi-step reaction by using 1,3,3,3-tetrafloroacetoacetic acid ethyl ester as a starting raw material. The hydrofluoroalkylene oxide can also be obtained by using this reaction.

The hydrofluoroalkylene oxide has a hydrogen atom or atoms in the molecule to remove excessive F radicals as HF, and gets moderately deposited on a mask to function as a protection layer. By these actions of the hydrofluoroalkylene oxide, the selectivity of etching of the etching target film layer is improved. Since the hydrofluoroalkylene oxide also gets deposited as a protection layer on sidewalls of trenches or holes formed in the etching target film layer during the etching process, it is assumed that an improvement is made to the selectivity of anisotropic etching relative to isotropic etching by F radicals. It is also expected that, since the hydrofluoroalkylene oxide has an oxygen-containing ring structure, the hydrofluoroalkylene oxide allows its own oxygen to remove a part of active species as $CO_2$ and thereby prevent clogging of the holes etc. caused by excessive deposition of the protection layer.

For use as the etching gas, it is preferable that the hydrofluoroalkylene oxide has a vapor pressure which is adequate in terms of handling. On this account, particularly preferred are 1,3,3,3-tetrafluoropropylene oxide, 2,3,3,3-tetrafluoropropylene oxide, 1,1,3,3,3-pentafluoropropylene oxide and 1,2,3,3,3-pentafluoropropylene oxide, each of which is relatively high in vapor pressure among the above hydrofluoroalkylene oxide compounds.

As mentioned before, it is already known that 1,1,1,2,3-pentafluoropropene, hexafluoro-2-butene, hexafluoro-1,3-butadiene, hexafluoropropene and the like are usable as etching gases. The use of these fluorinated olefin compounds is seemingly preferable as each has a plurality of fluorine atoms and shows a high etching rate to silicon oxide materials. As the etching gas, the fluorinated olefin compound is generally used in the form of a mixed gas thereof with oxygen so as to control the amount of polymer deposition. Because of the double bond or triple bond nature of the fluorinated olefin compound, however, polymerization of the fluorinated olefin compound proceeds significantly when the amount of oxygen is not appropriate. This can result in a problem of fouling in the etching device by excessive deposition of polymer or irregularities in the etching shape by deposition of polymer on the mask. On the other hand, the hydrofluoroalkylene oxide, which is the subject compound of the present invention, has no double bond or triple bond so that excessive formation of polymer can be suppressed.

In the present invention, the hydrofluoroalkylene oxide may be used in the form of being diluted with an inert gas such as $N_2$, He, Ar, Ne or Kr. In particular, a higher etching rate is achieved by the synergistic effect of the hydrofluoroalkylene oxide and Ar. The amount of the inert gas used is varied depending on the configurations and performance such as output, exhaust capacity etc. of the device and the properties of the etching target film. Preferably, the inert gas is used at a flow rate ranging from 1/10 to 20 times the flow rate of the hydrofluoroalkylene oxide.

The dry etching agent according to the present invention is applicable under various dry etching conditions. Depending on the properties, productivity, fine processing accuracy etc. of the etching target film, various additives may be added to the dry etching agent.

In the present invention, the hydrofluoroalkylene oxide is preferably contained in an amount of 1 to 60 vol % in the dry etching agent supplied to a chamber of the etching device. As will be explained below, it is preferable to mix 1 to 60 vol % of the hydrofluoroalkylene oxide with the following vol % ranges of additive gas and inert gas. (The term "additive gas" as used herein refers to an oxidizing gas such as $O_2$, $F_2$ etc. or a reducing gas such as $H_2$, CO etc.)

With the addition of the additive gas to the dry etching agent, the dry etching agent can provide a dramatically widened process window and address processing requirements such as low side etching ratio and high aspect ratio even without any special substrate excitation operation.

It is preferable to add the oxidizing gas as the additive gas in order to increase the etching rate for improvement of productivity. Specific examples of the oxidizing gas are: oxygen-containing gases such as $O_2$, $O_3$, CO, $CO_2$, $COCl_2$, $COF_2$, $CF_3OF$ and $NO_2$; and halogen-containing gases such as $F_2$, $NF_3$, $Cl_2$, $Br_2$, $I_2$, $CFCl_3$, $CF_2Cl_2$, $CF_3Cl$ and $YF_n$ (where Y=Cl, Br or I; and 1≤n≤7). Among others, $O_2$, $COF_2$, $F_2$, $NF_3$ and $Cl_2$ are preferred because the addition of these oxidizing gases leads to an increase in the etching rate of metal. Particularly preferred is $O_2$.

The amount of the oxidizing gas added is varied depending on the configurations and performance such as output etc. of the device and the properties of the etching target film. The oxidizing gas is generally added at a flow rate ranging from 1/10 to 30 times, preferably 1/10 to 10 times, the flow rate of the hydrofluoroalkylene oxide.

When the oxidizing gas is added at a flow rate more than 30 times the flow rate of the hydrofluoroalkylene oxide, the superior anisotropic etching performance of the hydrofluoroalkylene oxide may be impaired. When the flow rate of the oxidizing gas is less than 1/10 the flow rate of the hydrofluoroalkylene oxide, the polymerization deposit of the hydrofluoroalkylene oxide may significantly increase.

On the other hand, it is effective to add the reducing gas such as $CF_4$, $C_2H_2$, $C_2H_4$, $C_2H_6$, $C_3H_4$, $C_3H_6$, $C_3H_8$, HF, HI, HBr, HCl, NO, $NH_3$ or $H_2$ in order to reduce the amount of F radicals that accelerate isotropic etching.

When the amount of the reducing gas added is too large, the amount of F radicals effective for etching may significantly decrease to cause a deterioration of productivity. In particular, the addition of $H_2$ or $C_2H_2$ causes no change in the etching rate of $SiO_2$, but causes a decrease in the etching rate of Si, and thus lead to selective etching of $SiO_2$ relative to a silicon substrate.

The amount of the reducing gas added is varied depending on the configurations and performance such as output etc. of the device and the properties of the etching target film. The reducing gas is generally added at a flow rate ranging from 1/100 to 3 times, preferably 1/25 to 1 time, the flow rate of the hydrofluoroalkylene oxide.

The above additive gases can be used solely or in combination of two or more kinds thereof. The kind and amount of the additive gas used can be set as appropriate by a person skilled in the art.

In the present invention, the additive gas is added together with the inert gas such as $N_2$, He, Ar, Ne, Kr etc. to the dry etching agent.

As mentioned above, the dry etching agent according to the present invention contains the hydrofluoroalkylene oxide. The preferable composition of the dry etching agent is shown below with vol % of the respective gas components. Herein, the sum of vol % of the respective gas components is assumed as 100%.

In the case where the hydrofluoroalkylene oxide, the additive gas and the inert gas coexist in the dry etching agent, the ratio of vol % of the hydrofluoroalkylene oxide, the additive gas and the inert gas is preferably 1 to 60%:1 to 60%:5 to 98%, more preferably 4 to 40%:4 to 40%:20 to 92%.

Other halogen-containing gases may be added to the dry etching agent so as to, during etching of a workpiece with exposed films of different materials, control the etching selectivity ratio between the different materials and the like. For example, at least one kind of gas selected from the group consisting of $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_3H_5$, $C_3F_5H$, $C_3F_3H$, $C_3ClF_3H$, $C_4F_8$, $C_4F_6$, $C_5F_8$, $C_5F_{10}$, $C_3F_6$, $C_3HF_5$, $C_3H_2F_4$ and $C_3H_3F_3$ may be added for control of the selectivity ratio of SiN to $SiO_2$ or for control of the selectivity ratio of a metal material as a constituent material of an electrode of a semiconductor device to a silicon-based material. The addition of these gases leads to a change in the F/C ratio of the etching gas, thereby controlling the kind and amount of active species contained in plasma and adjusting the etching rate of various films. It is preferable to set the amount of the above gases added so as to change the F/C ratio of the etching gas without interfering with selective etching. The amount of the above gases added is preferably 0.01 to 2 times by volume the amount of the hydrofluoroalkylene oxide. Furthermore, fluoroiodomethane such as $CF_3I$, $CF_2I_2$ or $CFI_3$ may be added for improvement of the etching rate.

Next, an etching method using the dry etching agent according to the present invention will be explained below.

The etching method using the dry etching agent according to the present invention is particularly effectively applicable to a semiconductor material. Specific examples of the semiconductor material are silicon-based materials such as silicon, silicon dioxide, silicon nitride, silicon carbide, silicon oxyfluoride and silicon oxycarbide.

There is no particular limitation on the etching process and reaction conditions in the etching method using the dry etching agent according to the present invention. Various etching processes, such as reactive ion etching (RIE), electron cyclotron resonance (ECR) plasma etching and microwave etching, can be utilized. In the present invention, the etching method is carried out by generating a plasma of the hydrofluoroalkylene oxide in the etching device and performing etching treatment on a predetermined region of the target workpiece in the etching device. For example, the etching method can be applied to the production of a semiconductor device through the steps of forming a film of the silicon-based material on a silicon wafer, forming a resist film with a predetermined opening to the silicon-based material film, and then, etching the silicon-based material film through the opening of the resist film by the etching method.

The dry etching method using the dry etching agent according to the present invention can also be applied to the production of so-called microelectromechanical systems (MEMS) in each of which a machine element part, a sensor element, an actuator element and an electronic circuit are stacked on one silicon substrate, glass substrate, organic material or the like. Moreover, the production of semiconductor devices for existing MEMS products such as magnetic recording head, pressure sensor and accelerator sensor can be accomplished by the application of the etching method according to the present invention.

A plasma generator used for the etching treatment is not particularly limited. For example, the plasma generator can suitably be of high-frequency induction type, microwave type or the like.

The gas pressure during the etching treatment is preferably 0.133 to 133 Pa for efficient anisotropic etching. When the gas pressure is lower than 0.133 Pa, the etching rate may be lowered. The resist selectivity may be impaired when the gas pressure exceeds 133 Pa.

The ratio of the volumetric flow rates of the hydrofluoroalkylene oxide, the additive gas and the inert gas during the etching treatment is in the same range as the above-mentioned vol % ratio.

The flow rates of the respective gas components used depend on the size of the etching device and thus can be adjusted as appropriate by a person skilled in the art in accordance with the size of the etching device.

The temperature for the etching treatment is preferably 300° C. or lower. It is particularly preferable that the etching treatment temperature is 240° C. or lower for anisotropic etching. At a high temperature exceeding 300° C., the tendency of isotropic etching becomes strong so that there may occur a problem of failure to obtain a desired processing accuracy or significant etching of the resist film. For this reason, it is not preferable to perform the etching treatment at such a high temperature.

The reaction time for the etching treatment is not particularly limited. In general, the reaction time is approximately 5 minutes to 30 minutes. Since the reaction time depends on the progress of the etching treatment, it is desirable to adjust the reaction time as appropriate while monitoring the progress of the etching treatment.

It is possible to, for example, improve the etching rate selectivity between silicon and silicon oxide films in contact-hole processing by adding the reducing gas etc. as mentioned above and optimizing the pressure, flow rate, temperature etc. during the etching treatment.

EXAMPLES

The present invention will be described in more detail below by way of the following examples and comparative examples. It should however be understood that the present invention is not limited to the following examples.

As application examples of the dry etching agent according to the present invention to contact-hole processing, interlayer dielectric films ($SiO_2$) or silicon nitride films were subjected to etching treatment in Examples 1 to 7. Herein, Example 7 was an example in which the etching treatment was performed with the addition of 10% of $CF_3I$ to trans-1,3,3,3-tetrafluoropropylene oxide (abbreviated as "t-TFO"). Further, examples in which etching treatment was performed using perfluorocarbons such as $CF_4$ and $C_4F_8$ (octafluorocyclobutane) and $C_4F_6$ (hexafluoro-1,3-butadiene; $CF_2$=CF—CF=$CF_2$) were provided as Comparative Examples 1 to 8.

FIG. 1 is a schematic view of an experimental device used in the respective Examples.

In the experimental gas, a process gas was introduced through a gas introduction hole 16 that was connected to an upper electrode 5 in a chamber 11. After that, the pressure inside the chamber 11 was set to 2 Pa. The process gas was then excited by means of a high frequency power source 13 (13.5 MHz, 0.22 W/cm$^2$), thereby generating active species. The generated active species were supplied to a test sample 18 that was placed on a lower electrode 14, whereby the test sample 18 was etched by the active species.

Figure 2:
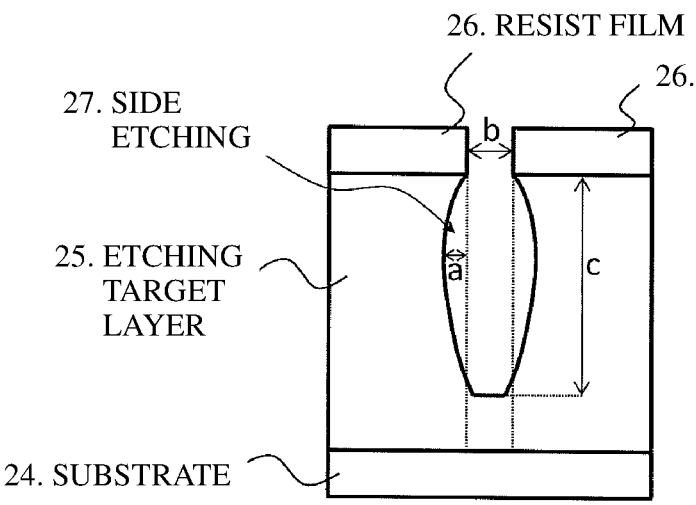
FIG. 2 is an illustration of an opening formed in a silicon wafer by etching treatment.

The test sample 18 used was those prepared by forming a $SiO_2$ film or silicon nitride film of 5 μm thickness on a single crystal silicon wafer and applying a resist mask with an opening of 0.3 μm line width to the film. The process gas used was those having a composition containing $C_4F_8$, $C_4F_6$, $CF_4$ or t-TFO as shown in TABLE 1. Using the process gas, the etching treatment was performed on the test sample 18 for 30 minutes at a process pressure of 2 Pa. After the etching treatment, a cross section of the silicon wafer sample was observed by an SEM. The etching rate, aspect ratio and side etching ratio of the sample were evaluated based on the observation results. The aspect ratio was determined by (c/b)×100 as shown in FIG. 2. The side etching ratio refers to the ratio of side etching amount (i.e. the amount of etching of sidewall) to the opening line width and was determined by R=(a/b)×100 as shown in FIG. 2.

The results of the above etching test are shown in TABLE 1.

TABLE 1

| | Kind of film | Etching gas | Etching gas flow rate [ml/min.] | Additive gas | Additive gas flow rate [ml/min.] | Oxygen flow rate [ml/min.] | Hydrogen flow rate [ml/min.] | Ar flow rate [ml/min.] | Etching rate [nm/min.] | Aspect ratio | Side etching ratio R |
|---|---|---|---|---|---|---|---|---|---|---|---|
| Example 1 | $SiO_2$ | t-TFO | 25 | — | 0 | 0 | 0 | 500 | 79 | 7 or higher | <1% |
| Example 2 | $SiO_2$ | t-TFO | 25 | — | 0 | 10 | 0 | 500 | 86 | 7 or higher | <1% |
| Example 3 | $Si_3N_4$ | t-TFO | 25 | — | 0 | 0 | 0 | 500 | 116 | 6 | 1.50% |
| Example 4 | $Si_3N_4$ | t-TFO | 25 | — | 0 | 10 | 0 | 500 | 131 | 5 | 1.70% |
| Example 5 | $SiO_2$ | t-TFO | 25 | — | 0 | 0 | 1 | 500 | 116 | 7 or higher | <1% |
| Example 6 | $Si_3N_4$ | t-TFO | 25 | — | 0 | 10 | 2 | 500 | 131 | 5 | 2.40% |
| Example 7 | $SiO_2$ | t-TFO | 25 | $CF_3I$ | 2.5 | 10 | 0 | 500 | 139 | 7 or higher | <1% |
| Comparative Example 1 | $SiO_2$ | $CF_4$ | 25 | — | 0 | 25 | 0 | 500 | 97 | 4 | 4.00% |
| Comparative Example 2 | $SiO_2$ | $CF_4$ | 20 | — | 0 | 30 | 0 | 500 | 104 | 4 | 15.20% |
| Comparative Example 3 | $Si_3N_4$ | $CF_4$ | 25 | — | 0 | 25 | 0 | 500 | 95 | 3 | 5.60% |
| Comparative Example 4 | $Si_3N_4$ | $CF_4$ | 20 | — | 0 | 30 | 0 | 500 | 99 | 3 | 17.30% |
| Comparative Example 5 | $SiO_2$ | $C_4F_8$ | 25 | — | 0 | 25 | 0 | 500 | 89 | 4 | 3.10% |
| Comparative Example 6 | $Si_3N_4$ | $C_4F_8$ | 25 | — | 0 | 25 | 0 | 500 | 71 | 3 | 6.20% |
| Comparative Example 7 | $SiO_2$ | $C_4F_6$ | 25 | — | 0 | 25 | 0 | 500 | 84 | 6 | 2.00% |
| Comparative Example 8 | $Si_3N_4$ | $C_4F_6$ | 25 | — | 0 | 25 | 0 | 500 | 65 | 4 | 5.20% |

As is apparent from the results of Examples 1 to 4, the dry etching agent according to the present invention showed a high aspect ratio, a low side etching ratio and a good contact hole processing shape as compared with $CF_4$, $C_4F_8$ and $C_4F_6$ used in Comparative Examples 1 to 8. As is apparent from the results of Example 5, the etching $SiO_2$ proceeded at a high aspect ratio and a low side etching ratio with the addition of hydrogen as compared to the case without the addition of hydrogen. As is apparent from the results of Example 7, the addition of CF$_3$I made a contribution to improved etching rate and thus was useful.

It has been shown by Examples 1 to 7 that the dry etching agent according to the present invention attains a high aspect ratio, a low side etching ratio and a good contact hole processing shape as compared to conventional etching gases CF$_4$, C$_4$F$_8$ and C$_4$F$_6$ used in Comparative Examples 1 to 8.

INDUSTRIAL APPLICABILITY

An agent containing the hydrofluoroalkylene oxide, which is the subject compound of the present invention, is suitably usable as a dry etching agent. The dry etching method using such a dry etching agent is suitable for production of semiconductor devices.

DESCRIPTION OF REFERENCE NUMERALS

10: Reaction device
11: Chamber
12: Pressure gauge
13: High-frequency power source
14: Lower electrode
15: Upper electrode
16: Gas introduction port
17: Gas discharge line
18: Test sample
24: Substrate
25: Etching target layer
26: Resist film
27: Side etching

The invention claimed is:

1. A dry etching agent comprising:
   at least one kind of hydrofluoroalkylene oxide selected from the group consisting of 1,3,3,3-tetrafluoropropylene oxide, 2,3,3,3-tetrafluoropropylene oxide, 1,1,3,3,3-pentafluoropropylene oxide and 1,2,3,3,3-pentafluoropropylene oxide;
   an inert gas; and
   an additive gas.

2. The dry etching agent according to claim 1,
   wherein the additive gas is an oxidizing gas or a reducing gas.

3. The dry etching agent according to claim 2,
   wherein the oxidizing gas is at least one kind of gas selected from the group consisting of an oxygen-containing gas and a halogen-containing gas,
   wherein the oxygen-containing gas is at least one kind of gas selected from the group consisting of O$_2$, O$_3$, CO, CO$_2$, COCl$_2$, COF$_2$, CF$_3$OF and NO$_2$,
   wherein the halogen-containing gas is at least one kind of gas selected from the group consisting of F$_2$, NF$_3$, Cl$_2$, Br$_2$, I$_2$, CFCl$_3$, CF$_2$Cl$_2$, CF$_3$Cl and YF$_n$, where Y is Cl, Br or I; and n is an integer satisfying $1 \leq n \leq 7$, and
   wherein the reducing gas is at least one kind of gas selected from the group consisting of CH$_4$, C$_2$H$_2$, C$_2$H$_4$, C$_2$H$_6$, C$_3$H$_4$, C$_3$H$_6$, C$_3$H$_8$, HF, HI, HBr, HCl, NO, NH$_3$ and H$_2$.

4. The dry etching agent according to claim 1,
   wherein the inert gas is at least one kind of gas selected from the group consisting of N$_2$, He, Ar, Ne and Kr.

5. The dry etching gas according to claim 1,
   wherein an amount of the hydrofluoroalkylene oxide contained in the dry etching gas is 1 to 60 vol %.

6. The dry etching agent according to claim 1, further comprising at least one kind of gas selected from the group consisting of CF$_4$, CF$_3$H, CF$_2$H$_2$, CFH$_3$, C$_2$F$_6$, C$_2$H$_4$H$_2$, C$_2$F$_5$H, C$_3$F$_8$, C$_3$F$_7$H, C$_3$F$_6$H$_2$, C$_3$F$_5$H$_3$, C$_3$F$_4$H$_4$, C$_3$F$_3$H$_5$, C$_3$F$_5$H, C$_3$F$_3$H, C$_4$F$_8$, C$_4$F$_6$, C$_5$F$_8$, C$_5$F$_{10}$, C$_3$F$_6$, C$_3$HF$_5$, C$_3$H$_2$F$_4$, C$_3$H$_3$F$_3$, CF$_3$I, CF$_2$I$_2$ and CFI$_3$.

7. The dry etching agent according to claim 1,
   wherein the hydrofluoroalkylene oxide is 1,3,3,3-tetrafluoropropylene oxide.

8. A dry etching method for selectively etching a silicon-based material with the use of a plasma gas generated by plasmatization of a dry etching agent,
   wherein the dry etching agent comprises at least one kind of hydrofluoroalkylene oxide selected from the group consisting of 1,3,3,3-tetrafluoropropylene oxide, 2,3,3,3-tetrafluoropropylene oxide, 1,1,3,3,3-pentafluoropropylene oxide and 1,2,3,3,3-pentafluoropropylene oxide; an inert gas; and an additive gas, and
   wherein the silicon-based material is at least one kind selected from the group consisting of silicon dioxide, silicon nitride, polycrystalline silicon, amorphous silicon and silicon carbide.

9. The dry etching method according to claim 8,
   wherein the dry etching agent consists of the following components: (A) the at least one kind of hydrofluoroalkylene oxide; (B) at least one kind or more kinds of gases selected from the group consisting of H$_2$, CO$_2$, CO and COF$_2$ as the additive gas; and Ar as the inert gas,
   wherein a ratio of volumetric flow rates of the components (A) and (B) and Ar is in a range of 1 to 60%:1 to 60%:5 to 98%, with the proviso that a sum of the respective volumetric flow rates is 100%, and
   wherein the silicon-based material is at least one kind selected from the group consisting of silicon dioxide and silicon nitride.

10. The dry etching method according to claim 8,
    wherein the hydrofluoroalkylene oxide is 1,3,3,3-tetrafluoropropylene oxide.

11. The dry etching method according to claim 8,
    wherein the dry etching agent further comprises hydrogen, and
    wherein silicon dioxide is selectively etched as the silicon-based material.

12. A method for producing a semiconductor device, comprising:
    forming, on a substrate, a silicon-based material film of at least one kind selected from the group consisting of silicon dioxide, silicon nitride, polycrystalline silicon, amorphous silicon and silicon carbide;
    forming a resist film with a predetermined opening on the silicon-based material film; and
    etching the silicon-based material film through the opening by the dry etching method according to claim 8.

* * * * *